（12）United States Patent
Kurose

(10) Patent No.: US 10,529,576 B2
(45) Date of Patent: Jan. 7, 2020

(54) MULTI-FACED MOLDED SEMICONDUCTOR PACKAGE AND RELATED METHODS

(71) Applicant: SEMICONDUCTOR COMPONENTS INDUSTRIES, LLC, Phoenix, AZ (US)

(72) Inventor: Eiji Kurose, Oizumi-machi (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 1 day.

(21) Appl. No.: 15/679,661

(22) Filed: Aug. 17, 2017

(65) Prior Publication Data

US 2019/0057874 A1    Feb. 21, 2019

(51) Int. Cl.

| | | |
|---|---|---|
| *H01L 21/78* | (2006.01) |
| *H01L 21/302* | (2006.01) |
| *H01L 21/56* | (2006.01) |
| *H01L 23/31* | (2006.01) |
| *H01L 21/48* | (2006.01) |
| *H01L 23/12* | (2006.01) |
| *H01L 23/00* | (2006.01) |

(52) U.S. Cl.
CPC .......... *H01L 21/302* (2013.01); *H01L 21/48* (2013.01); *H01L 21/565* (2013.01); *H01L 23/12* (2013.01); *H01L 23/3185* (2013.01); *H01L 24/04* (2013.01); *H01L 24/26* (2013.01)

(58) Field of Classification Search
CPC ...................................... H01L 21/78
See application file for complete search history.

(56) References Cited

U.S. PATENT DOCUMENTS 6,319,796 B1 *  11/2001  Laparra ............ H01L 21/76224
                                                         438/435
9,496,193 B1   11/2016  Roesner
(Continued)

FOREIGN PATENT DOCUMENTS

CN        104201114 A      12/2014

OTHER PUBLICATIONS

Extended European Search Report, European Patent Application No. 18184165.1, dated Jan. 17, 2019, 8 pages.
(Continued)

*Primary Examiner* — Peniel M Gumedzoe
*Assistant Examiner* — Christopher A Johnson
(74) *Attorney, Agent, or Firm* — Adam R. Stephenson, Ltd.

(57) ABSTRACT

Implementations of a method of forming a semiconductor package may include forming electrical contacts on a first side of a wafer, applying a photoresist layer to the first side of the wafer, patterning the photoresist layer, and etching notches into the first side of the wafer using the photoresist layer. The method may include applying a first mold compound into the notches and over the first side of the wafer, grinding a second side of the wafer opposite the first side of the wafer to the notches formed in the first side of the wafer, applying one of a second mold compound and a laminate resin to a second side of the wafer, and singulating the wafer into semiconductor packages. Six sides of a die included in each semiconductor package may be covered by one of the first mold compound, the second mold compound, and the laminate resin.

19 Claims, 10 Drawing Sheets

(56) References Cited

U.S. PATENT DOCUMENTS

| | | |
|---|---|---|
| 2008/0014677 A1 | 1/2008 | Xiaochun |
| 2009/0215227 A1 | 8/2009 | Tan |
| 2011/0175242 A1* | 7/2011 | Grivna .................... H01L 21/78 |
| | | 257/787 |
| 2014/0217556 A1 | 8/2014 | Peh et al. |
| 2016/0225733 A1* | 8/2016 | Wilcoxen ................ H01L 24/14 |
| 2017/0032981 A1 | 2/2017 | Chinnusamy |
| 2017/0033026 A1 | 2/2017 | Ho |
| 2017/0243846 A1* | 8/2017 | Chen ....................... H01L 24/05 |

OTHER PUBLICATIONS

Insulating Film Ajinomoto Build-Up Film, Ajinomoto Fine-TechnoCo., Inc., available at https://www.aft-website.com/en/electron/abf. Last visited Jul. 14, 2017.

JCAP Sidewall Isolated 0201/01005 DSN, Slide from JCAP, available at least as early as Jun. 22, 2017.

\* cited by examiner

MULTI-FACED MOLDED SEMICONDUCTOR PACKAGE AND RELATED METHODS

BACKGROUND

1. Technical Field

Aspects of this document relate generally to semiconductor packages, such as chip scale packages and flip chip packages. More specific implementations involve semiconductor packages covered by a mold compound.

2. Background

Decreasing semiconductor package size has long been desirable within the industry as it has generally resulted in economic benefits as well as technological benefits. A decrease in semiconductor package size often results in an increase in risk of damage to the semiconductor die and package during manufacturing. A protective cover or molding has generally covered portions of the semiconductor packages to protect the semiconductor from, among other things, the environment, electrostatic discharge, and electrical surges.

SUMMARY

Implementations of a method of forming a semiconductor package may include forming a plurality of electrical contacts on a first side of a wafer, applying a photoresist layer to the first side of the wafer, patterning the photoresist layer, and etching a plurality of notches into the first side of the wafer using the photoresist layer. The method may include applying a first mold compound into the plurality of notches and over the first side of the wafer, grinding a second side of the wafer opposite the first side of the wafer to the plurality of notches formed in the first side of the wafer, applying one of a second mold compound and a laminate resin to a second side of the wafer, and singulating the wafer into a plurality of semiconductor packages. Six sides of each semiconductor die may be covered by one of the first mold compound, the second mold compound, and the laminate resin.

Implementations of a method of forming a semiconductor package may include one, all, or any of the following:

The first mold compound may be applied using one of a printer molding technique and a compression molding technique.

A perimeter of a first side of a die within the package may be substantially one of an octagon and a rectangle with rounded corners.

The plurality of notches may be etched into the first side of the wafer using the photoresist layer and one of a polyimide, a polybenzoxazole, and a phenol resin.

The plurality of notches may be etched into the first side of the wafer using the photoresist layer and a passivation mask.

One of a solder resist layer, a passivation layer, an interlayer, and a combination of a solder resist layer, a passivation layer, and an interlayer may be coupled to the first side of the wafer and may be covered by the first mold compound.

An etching process may be used to singulate the plurality of packages.

Implementations of a method of forming a semiconductor package may include forming a metal layer on a first side of a wafer, applying a first photoresist layer on the metal layer, patterning the first photoresist layer, forming electrical contacts coupled to the metal layer using the first photoresist layer, removing the first photoresist layer, etching the metal layer, and etching a plurality of notches into the first side of the wafer. The method may include applying a first mold compound into the plurality of notches, over the electrical contacts, and over the first side of the wafer, exposing the electrical contacts through the first mold compound through grinding the first mold compound, grinding a second side of the wafer opposite the first side of the wafer to the plurality of notches formed in the first side of the wafer, applying one of a second mold compound and a laminate resin to the second side of the wafer, and singulating the wafer into a plurality of semiconductor packages. Each semiconductor die may be covered by one of a first molding compound, the second molding compound, and a laminate resin on the first side, the second side, a third side, a fourth side, a fifth side, and a sixth side of each semiconductor die.

Implementations of a method of forming a semiconductor package may include one, all, or any of the following:

A first side of a die within each semiconductor package may include a perimeter that is one of an octagon and a rectangle with rounded edges.

The first mold compound may be anchored to a sidewall of the plurality of notches through a plurality of ridges formed in the sidewall of the plurality of notches.

The plurality of notches may be formed using a deep reactive-ion etching technique during etching of the plurality of notches.

The plurality of notches may be etched into the first side of the wafer using one of a polyimide, a polybenzoxazole, and a phenol resin.

The plurality of notches may be etched into the first side of the wafer using a passivation mask.

One of a solder resist layer, a passivation layer, an interlayer, and a combination of a solder resist layer, a passivation layer, and an interlayer may be coupled to the first side of the wafer and may be covered by the first mold compound.

Implementations of a semiconductor package may include a die including a first side, a second side, a third side, a fourth side, a fifth side, and a sixth side, the first side of the die including a plurality of electrical contacts. The package may include a first mold compound covering the first side of the die, the second side of the die, the third side of the die, the fourth side of the die, and the fifth side of the die, wherein the plurality of electrical contacts extend through a plurality of openings in the first mold compound. The package may include one of a second mold compound and a laminate resin covering the sixth side of the die, wherein there is no die chipping of the first side of the die after singulation of the die.

Implementations of a method of forming a semiconductor package may include one, all, or any of the following:

The sixth side may oppose the first side.

A perimeter of the first side of the die may include one of an octagon and a rounded rectangle.

The first mold compound may be anchored to the second side of the die, the third side of the die, the fourth side of the die, and the fifth side of the die through a plurality of ridges formed in the second side of the die, the third side of the die, the fourth side of the die, and the fifth side of the die.

The plurality of electrical contacts may include one of a combination of nickel, gold, and aluminum and a combination of tin, silver, and copper.

The package may include one of a solder resist layer, a passivation layer, an interlayer, and a combination of a solder resist layer, a passivation layer, and an interlayer coupled to the first side of the wafer and covered by the first mold compound.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended semiconductor package will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor packages, and implementing components and methods, consistent with the intended operation and methods.

Figure 1:
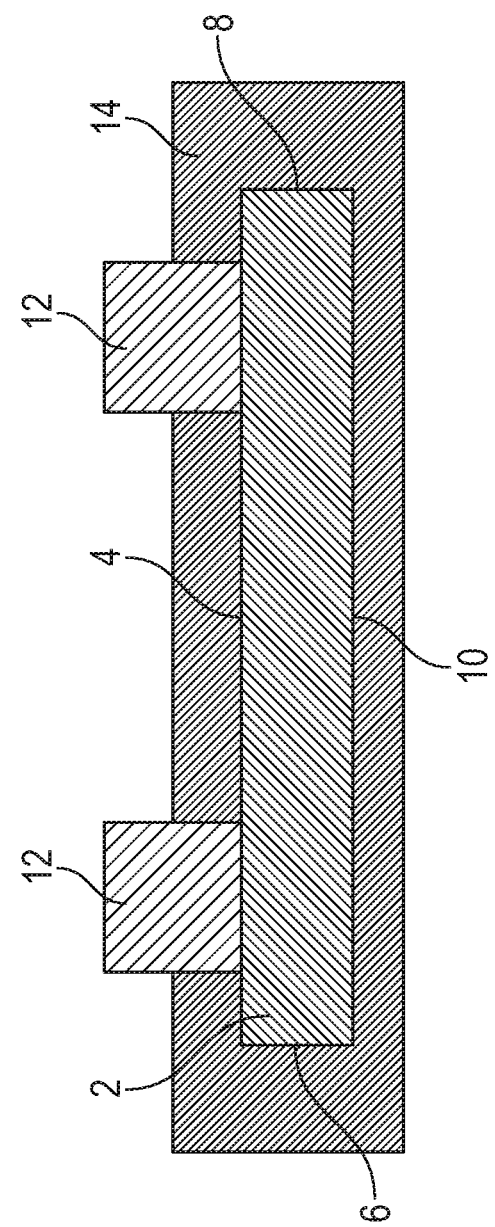
FIG. 1 is a cross sectional side view of a semiconductor package.

Referring to FIG. 1, a cross sectional side view of a semiconductor package is illustrated. The semiconductor package includes a die 2 which includes a first side 4, a second side 6, a third side 8 opposite the second side 6, a fourth side, a fifth side opposite the fourth side (both fourth and fifth sides are located into and out of the drawing surface in this view), and a sixth side 10 opposite the first side 4. In various implementations, the second side 6 of the die 2, the third side 8 of the die, the fourth side of the die, and/or the fifth side of the die may include a notch therein.

In various implementations, one or more electrical contacts 12 are coupled to the first side 4 of the die 2. In various implementations, the electrical contacts are metal and may be, by non-limiting example, copper, silver, gold, nickel, titanium, aluminum, any combination or alloy thereof, or another metal. In still other implementations, the electrical contacts 12 may not be metallic but may rather be another electrically conductive material.

In various implementations, a first mold compound 14 covers the first, second, third, fourth, and fifth sides of the die. In various implementations, the mold compound may be, by non-limiting example, an epoxy mold compound, an acrylic molding compound, or another type of material capable of physically supporting the die and providing protection against ingress of contaminants. In various implementations, a laminate resin or second mold compound covers the sixth side 10 of the die.

The electrical contacts 12 each extend through a corresponding plurality of openings in the first mold compound 14. In various implementations, the electrical contacts 12 extend beyond the surface of the molding 14, as illustrated in FIG. 1, while in other implementations the electrical contacts are level or flush with the surface of the molding compound 14.

In various implementations, the sides of the die will have no chips or cracks, particularly on the semiconductor device side of the die. This is accomplished through forming the second, third, fourth, and fifth sides of each die using etching techniques rather than a conventional sawing technique. Such a method is more fully disclosed is association with the discussion of FIG. 3 herein.

Further, the first mold compound may be anchored to the second, third, fourth, and fifth sides of the die. In various implementations, the anchor effect is the result of interaction of the mold compound with a plurality of ridges formed along the second, third, fourth, and fifth sides of the die. This anchoring effect is more fully disclose in association with the discussion of FIG. 3 herein.

Figure 2:
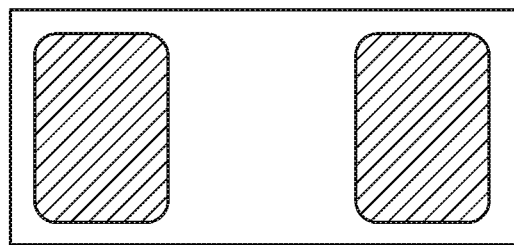
FIG. 2 is a top view of a semiconductor package.

Referring to FIG. 2, a top view of a semiconductor package is illustrated. The molding compound 14 is clearly seen in FIG. 2 encompassing a perimeter of each electrical contact 12 (the shaded areas in FIG. 2) so that the entire first side of the die (along with every other side) is not exposed.

Figure 3:
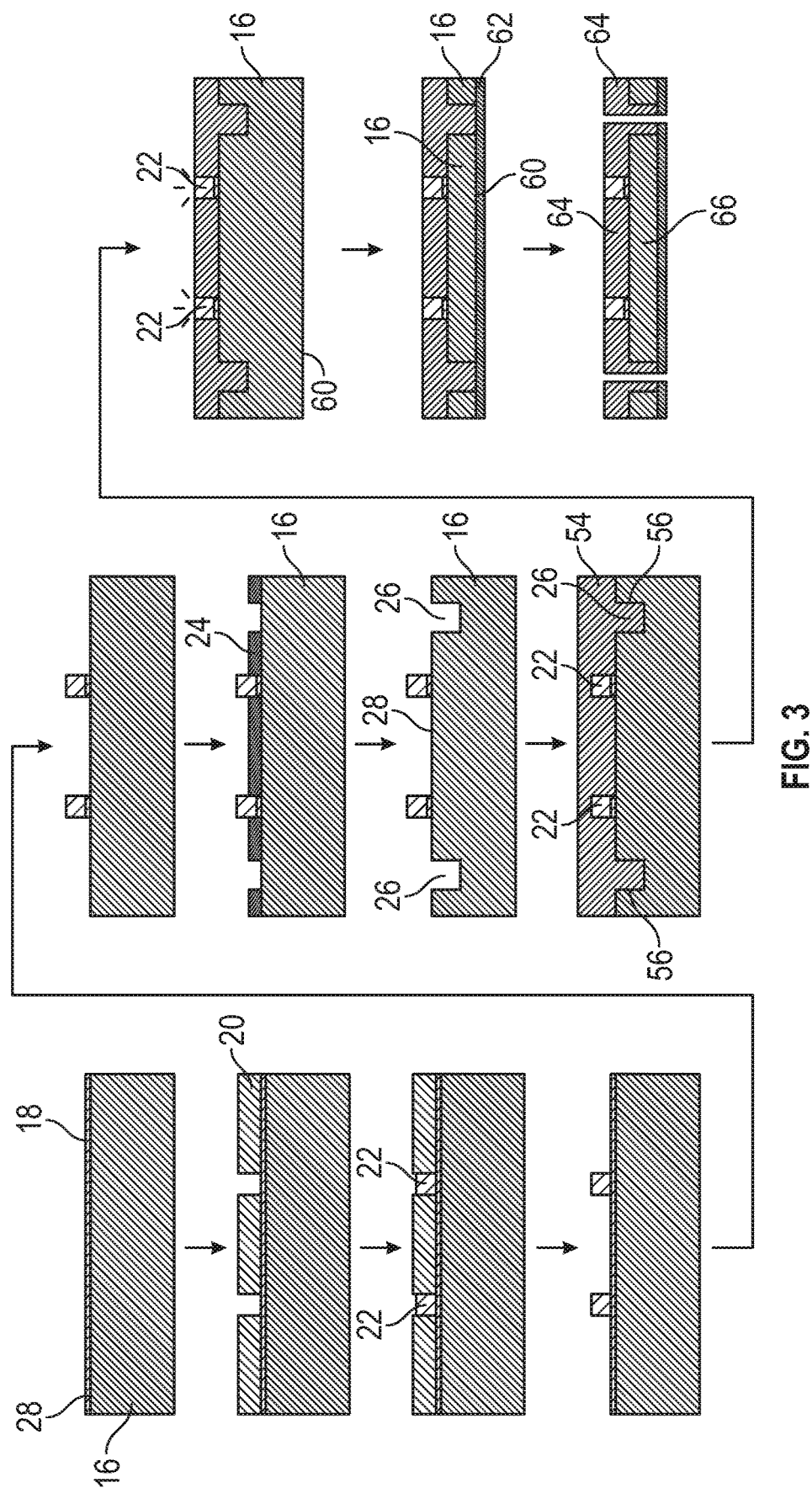
FIG. 3 is a first process flow illustrating the formation of a semiconductor package.

Referring to FIG. 3, a first process flow illustrating the formation of a semiconductor package is illustrated. In various implementations, the method for making a semiconductor package includes providing a wafer 16 which may include any particular type of substrate material, including, by non-limiting example, silicon, sapphire, ruby, gallium arsenide, glass, or any other semiconductor wafer substrate type. In various implementations, a metal layer 18 is formed on a first side 28 of the wafer 16 and may be formed using a sputtering technique. In other implementations, the metal layer 18 is formed using other techniques, such as, by non-limiting example, electroplating, electroless plating, chemical vapor deposition, and other methods of depositing a metal layer. In a particular implementation, the metal layer is a titanium/copper seed layer, while in other implementations, the metal layer may include, by non-limiting example, copper, titanium, gold, nickel, aluminum, silver, or any combination or alloy thereof.

In various implementations, a first photoresist layer 20 is formed and patterned over the metal layer 18. One or more electrical contacts 22 may be formed on the metal layer 18 and within the photoresist layer 20. In various implementations this may be done using various electroplating or electroless plating techniques, though deposition and etching techniques could be employed in various implementations. The electrical contacts 22 may be any type of electrical contact previously disclosed herein (bumps, studs, and so forth). In various implementations, the first photoresist layer 20 is removed through an ashing or solvent dissolution process and the metal layer 18 may be etched away after the electrical contacts are formed.

Figure 9:
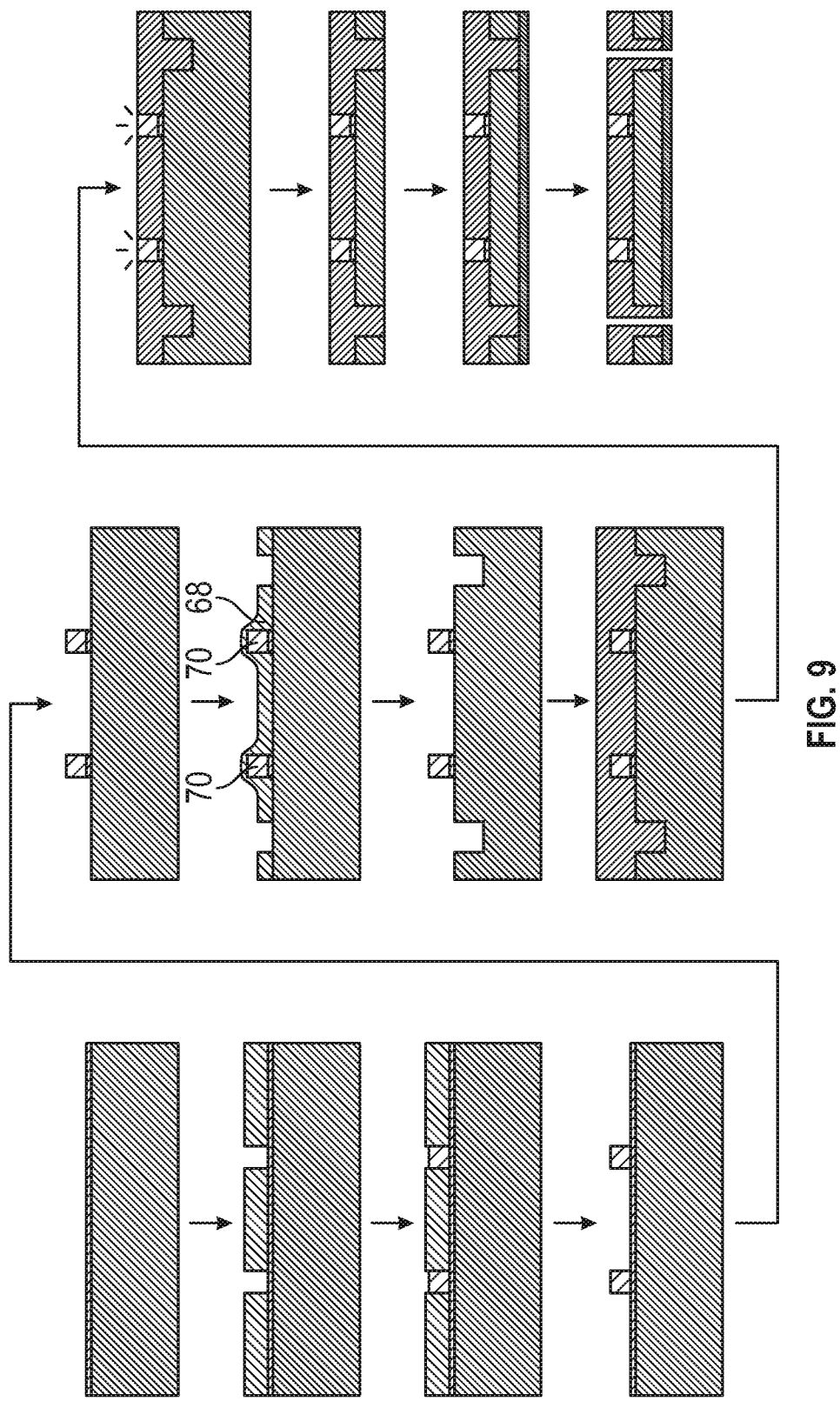
FIG. 9 is a second process flow illustrating the formation of a semiconductor package.

In various implementations, a second photoresist layer 24 is formed and patterned over the wafer 16. In various implementations, as illustrated in FIG. 3, the second patterned photoresist layer 24 does not cover the electrical contacts 22. In other implementations, the second photoresist layer is formed conformally over the electrical contacts along with the wafer. Referring to FIG. 9, a second process flow illustrating the formation of a semiconductor package is illustrated. In this process flow, a second photoresist layer 68 is formed as a conformal layer over the electrical contacts 70. Aside from this difference, the process depicted in FIG. 9 includes the same process steps as the process depicted in FIG. 3.

Referring back to FIG. 3, in various implementations, the method includes etching a plurality of notches 26 into the first side 28 of the wafer 16 using the second patterned photoresist layer. In various implementations, the width of the notches may be between about 50 and about 150 microns wide while in other implementations, the width of the notches may be less than about 50 microns or more than about 150 microns. In various implementations, the depth of the plurality of notches 26 may extend between about 25 and 200 microns into the wafer while in other implementations, the depth of the plurality of notches 26 may be less than about 25 microns or more than about 200 microns.

In various implementations, the plurality of notches may be formed using, by non-limiting example, plasma etching, deep-reactive ion etching, or wet chemical etching. In various implementations, a process marketed under the tradename BOSCH® by Robert Bosch GmbH, Stuttgart Germany (the "Bosch process"), may be used to form the plurality of notches 26 in the first side 28 of the wafer 16.

Figure 4:
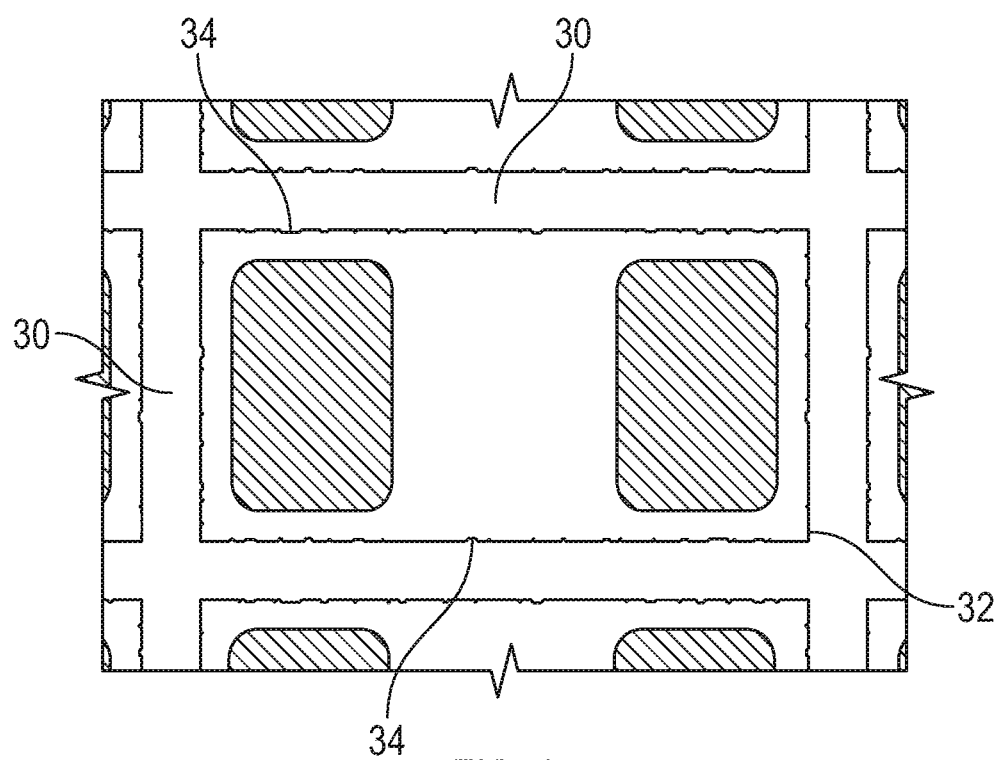
FIG. 4 is a top view of a semiconductor wafer with a plurality of notches cut therein.

Referring now to FIG. 4, a top view of a conventional semiconductor wafer with a plurality of saw cuts surrounding the plurality of die is illustrated. Using a saw to cut notches in a semiconductor wafer invariably results in the production of chips and cracks on the device side of the die and in the sidewalls 34 of the notches 30. The presence of the cracks and chips has the potential to compromise the reliability of the semiconductor package if the cracks and chips propagate into the device portion of the semiconductor die. Since the saw process involves the rubbing of the rotating blade against the die surface, the chipping and cracking can only be managed through saw processing variables (wafer feed speed, blade kerf width, cut depth, multiple saw cuts, blade materials, etc.) but not eliminated. Furthermore, because the saw process relies on passing the wafer underneath the blades, only square and rectangular sized die are typically produced using conventional saw techniques.

Figure 5:
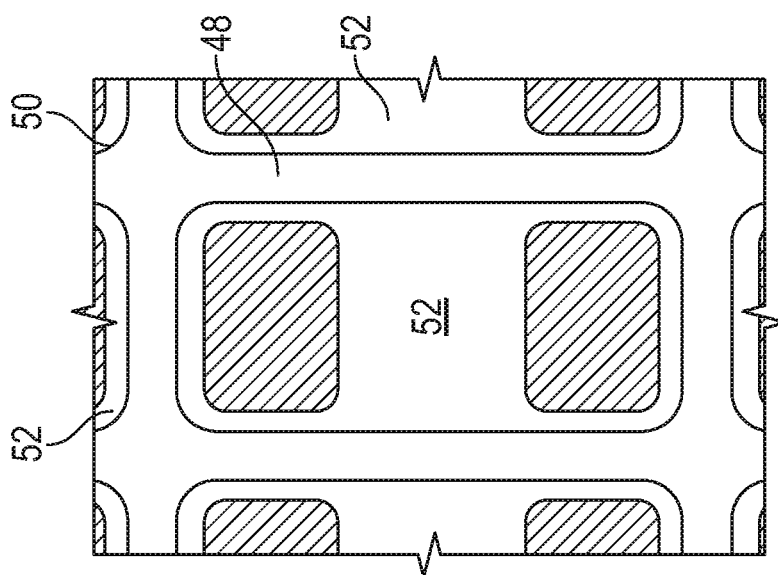
FIG. 5 is a top view of a semiconductor wafer with a plurality of notches etched therein.

Referring to FIG. 5, a top view of a semiconductor wafer with a plurality of notches etched therein is illustrated. In contrast to the appearance of the die processed using the conventional sawing method illustrated in FIG. 4, the plurality of notches 36 in the wafer 38 formed using etching techniques have edges and sidewalls 40 that do not exhibit cracks or chips therein. Because of the absence of the cracks and chips, the use of etching techniques to form a plurality of notches in a semiconductor wafer is likely to improve the reliability of the resulting semiconductor packages.

Figure 6:
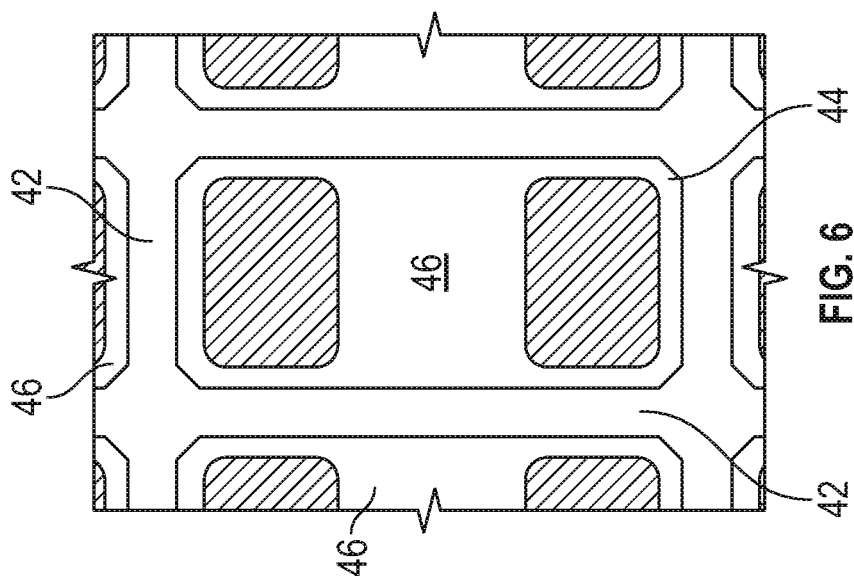
FIG. 6 is a top view of a second implementation of a semiconductor wafer with a plurality of notches etched therein.
Figure 7:
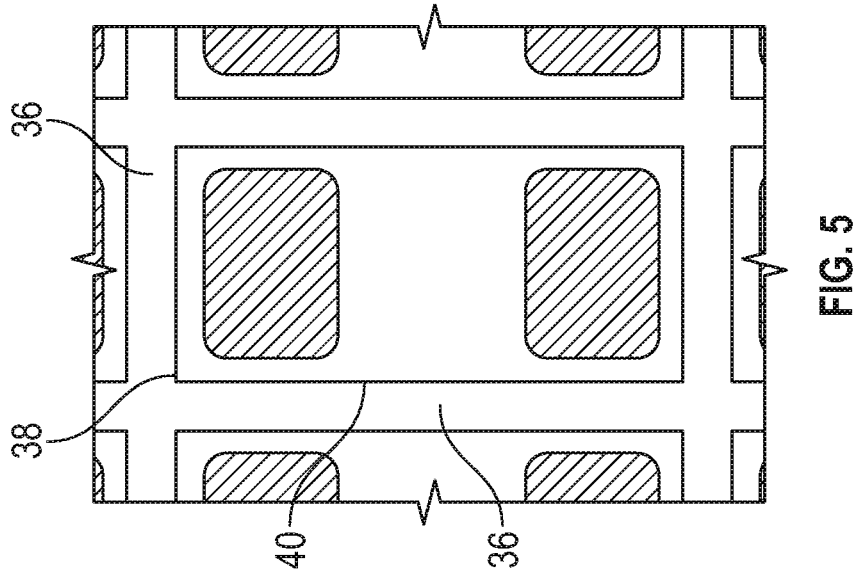
FIG. 7 is a top view of a third implementations of a semiconductor wafer with a plurality of notches etched therein.

Furthermore, using etching techniques to form a plurality of notches in a wafer allows for different shapes of perimeters of die to be produced. In various implementations, the second photoresist layer described in relation to FIG. 3 may be patterned in a way to form a plurality of notches that do not form die with rectangular perimeters. For example, referring to FIG. 6, a top view of a second implementation of a semiconductor wafer with a plurality of notches etched therein is illustrated. In various implementations, a plurality of notches 42 may be formed in a wafer 44. The plurality of notches 42 may form eventual die 46 with perimeters that are octagons. Referring to FIG. 7, a top view of a third implementations of a semiconductor wafer with a plurality of notches etched therein is illustrated. In various implementations, a plurality of notches 48 may be formed in a wafer 50. The plurality of notches 48 may form eventual die 52 with perimeters that are rounded rectangles. In other implementations, a plurality of notches may be formed in a wafer that form eventual die with perimeters that are any other closed geometrical shape.

Referring back to FIG. 3, in various implementations, the plurality of notches 26 formed have two substantially parallel sidewalls that extend substantially straight into the first side 28 of the wafer 16. In other implementations, two or more stepwise notches are formed in the first side 28 of the wafer 16. Each stepwise notch may be formed by creating a first notch in the wafer, and then forming a second more narrow notch within each first notch.

Referring to FIG. 3, an implementation of a method for forming a semiconductor package includes applying a first mold compound 54 into the plurality of notches 26 and over the first side of the wafer. In various implementations, as illustrated by FIG. 3, the first mold compound 54 may cover the electrical contacts 22. In other implementations, the first mold compound 54 may not completely cover the electrical contacts 22. The first mold compound may be applied using, by non-limiting example, a liquid dispensing technique, a transfer molding technique, a printer molding technique, or a compression molding technique. The molding compound may be an epoxy molding compound, an acrylic molding compound, or another type of molding compound disclosed herein.

Figure 8:
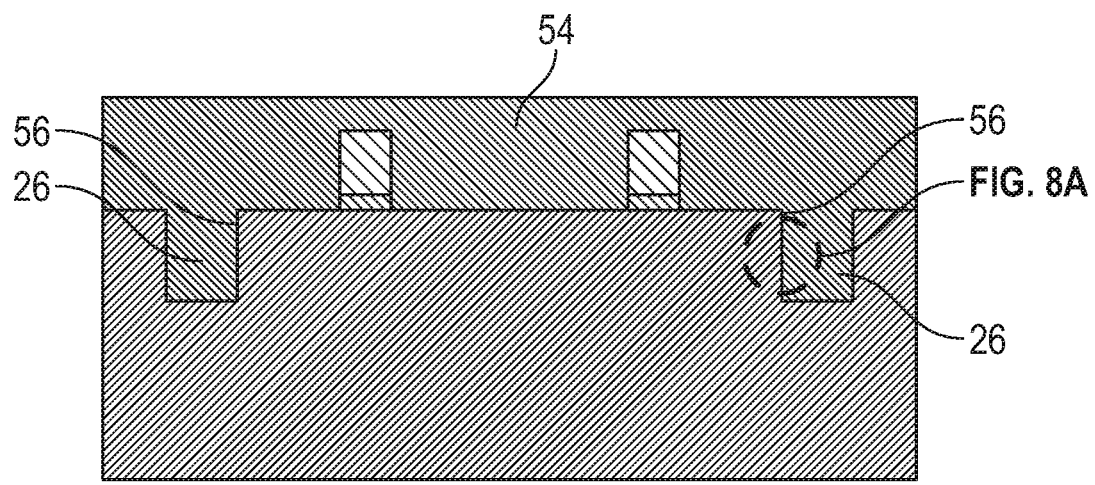
FIG. 8 is a cross sectional view of a portion of a wafer with molding applied thereto.
Figure 8A:
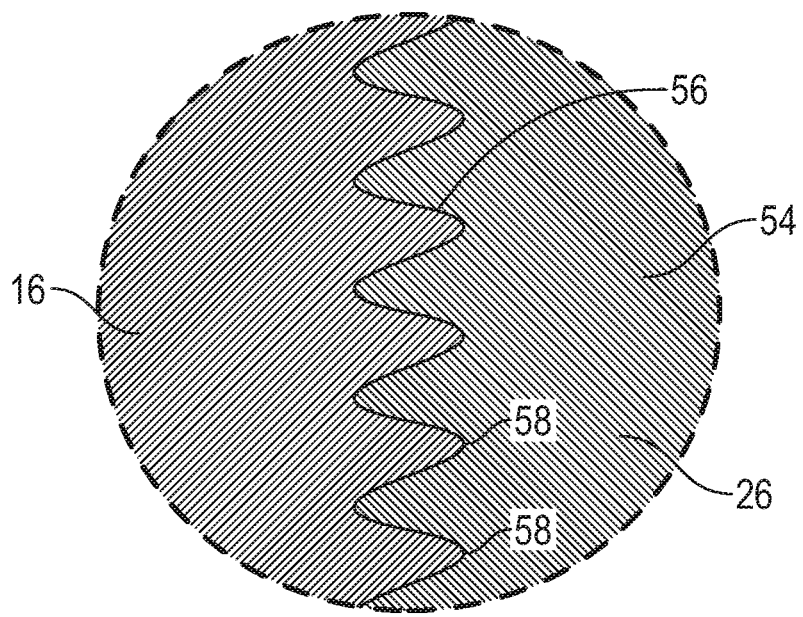
FIG. 8A is a magnified cross sectional view of the bond between a mold and a sidewall of a notch formed in the die.

In various implementations, the first mold compound 54 may be anchored to a plurality of sidewalls 56 of a plurality of notches 26. Referring now to FIG. 8, a cross sectional view of a portion of a wafer with molding applied thereto is illustrated. Referring now to FIG. 8A, a magnified cross sectional view of the bond between a mold and a sidewall of a notch formed in the die is illustrated. In various implementations, a plurality of ridges 58 may be formed in a sidewall 56 of each notch within the plurality of notches. In a particular implementation, the height of each ridge extending from the sidewall is substantially 0.2 microns tall with a pitch of substantially one micron. Thus, in implementations where the notch is 150 microns deep, there may be substantially 150 microns on each sidewall of the notch. In other implementations, the notches may be taller or shorter than 0.2 microns and may have a pitch more or less than one micron. The ridges may anchor the first mold compound 54 to the sidewalls 56 of the plurality of notches. In various implementations where the plurality of notches are etched using the Bosch process, the etching process may form ridges in the plurality of notches while etching the plurality of notches via the deposition/etching cycles of the deep reactive ion etch, thus increasing the adhesion between the first mold compound and the sidewall of each notch.

Referring back to FIG. 3, in various implementations where the first mold compound 54 covers the electrical contacts 22, the electrical contacts 22 may be exposed by grinding the first mold compound. In various implementations, a second side 60 of the wafer 16 may be ground to the plurality of notches 26 formed in the first side 28 of the wafer 16. In this way the various die of the semiconductor wafer are singulated from each other. In various implementations, the second side 60 of the wafer 16 may be ground using, by non-limiting example, a mechanical polishing technique, a chemical etching technique, a combination of a mechanical polishing and chemical etching technique, or any other grinding technique.

In various implementations, a second mold compound 62 or a laminate resin may be applied to the second side 60 of the wafer 16. In implementations where a second mold compound is applied, the mold compound may be any type of mold compound disclosed herein and may be applied using any technique disclosed herein.

In various implementations, as illustrated in the process flow depicted in FIG. 3, the first mold compound 54 is ground to expose the electrical contacts 22 before the second side 60 of the wafer 16 is ground and the second mold compound is applied. In other implementations, the first mold compound 54 may be ground to expose the electrical contacts 22 after the second side 60 of the wafer 16 is ground and the second mold compound is applied.

The method for making a semiconductor package includes singulating the wafer 16 into a plurality of semiconductor packages 64. The wafer 16 may be singulated by cutting or etching through the wafer where the plurality of notches 26 were originally formed. The wafer may be singulated by using, by non-limiting example, a saw, a laser, a waterjet, plasma etching, deep reactive-ion etching, or chemical etching. In various implementations, the Bosch process may be used to singulate the wafer 16. The method used to singulate the wafer may include singulating the wafer using thinner cuts or etches than were used to form the plurality of notches 26. In this manner, the first mold compound will cover the sides of each singulated die 66 within each semiconductor package 64. Specifically, in particular implementations the saw width used to singulate each semiconductor package may be between 20 and 40 microns thick. The semiconductor die within the semiconductor package may be covered by either a mold compound or a laminate resin on all six sides of the semiconductor die.

In various implementations, the first side of the die within each semiconductor package may include a perimeter that is, by non-limiting example, a rectangle, an octagon, a rectangle with rounded edges, or any other closed geometric shape.

Figure 10:
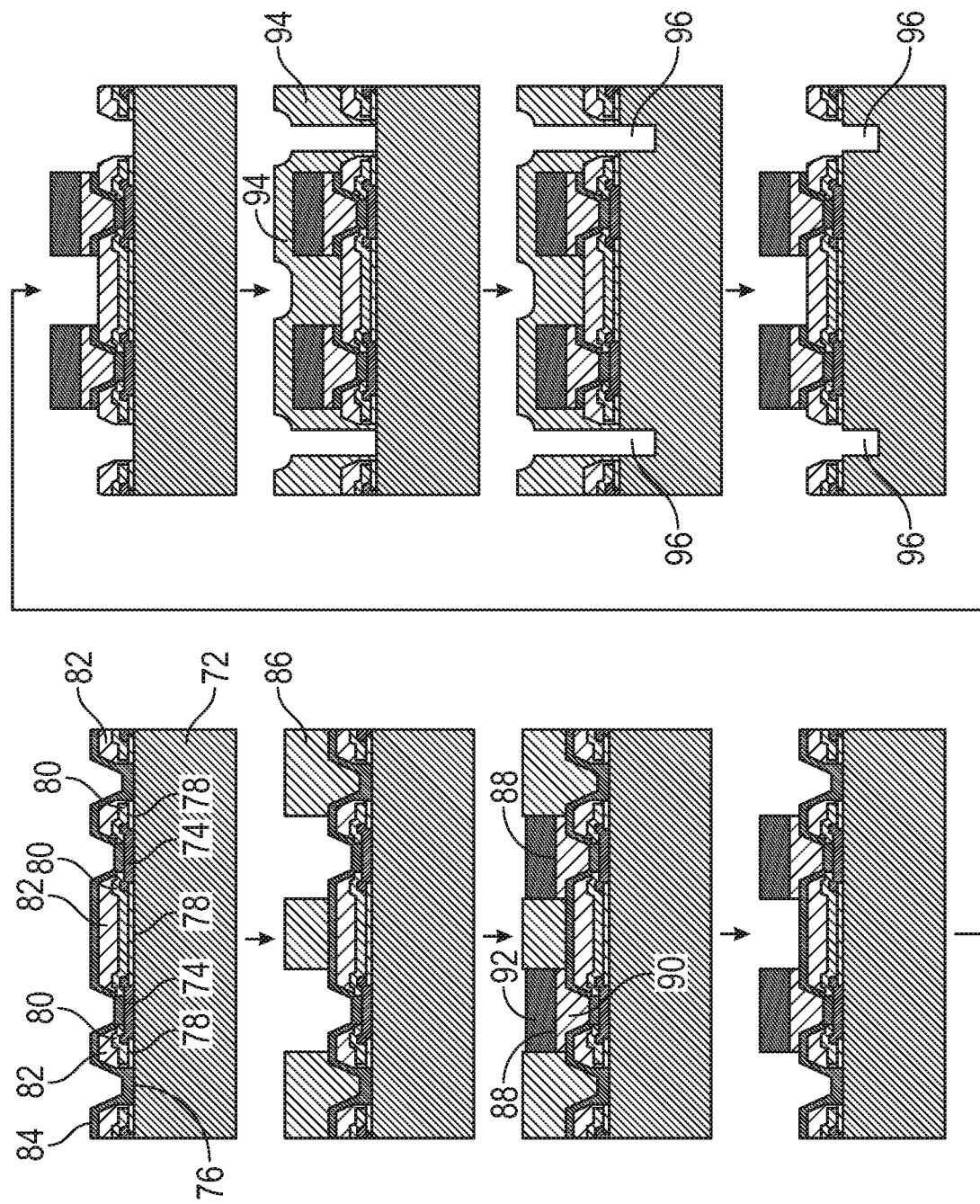
FIG. 10 is a third process flow illustrating a portion of the formation of a semiconductor package.

Referring now to FIG. 10, a third process flow illustrating a portion of the formation of a semiconductor package is illustrated. In various implementations the method for forming a semiconductor package includes providing a wafer 72, which may be any type of wafer substrate disclosed herein. In various implementations, one or more metal pads 74 may be coupled to a first side 76 of the wafer 72. The metal pad may include, by non-limiting example, aluminum, copper, nickel silver, gold, titanium, or any combination or alloy thereof.

In various implementations, a first passivation layer 78 may be coupled to a portion of the first side 76 of the wafer 72. The first passivation layer 78 may be a silicon dioxide passivation layer in various implementations, though it could be any of a wide variety of other types of layers, including, by non-limiting example, silicon nitride, polyimide, or another polymer or deposited material. In various implementations, a second passivation layer 80 may be coupled to a portion of the first side 76 of the wafer 72. The second passivation layer 80 may be a silicon nitride passivation layer. The second passivation layer may include the same material or a different material from the first passivation layer.

In various implementations, a third layer 82 may be coupled to a portion of the first side 76 of the wafer 72. The third layer may be either a polyimide, a polybenzoxazole, a phenol resin, or a combination of a polyimide, a polybenzoxazole, and a phenol resin. In various implementations, a metal seed layer 84 may be formed over the third layer and over the first side 76 of the wafer 72. The metal seed layer 84 may be any type of metal layer disclosed herein. In various implementations, the metal seed layer 84 may directly contact portions of the first side 76 of the wafer 72. In various implementations, the method includes forming and patterning a first photoresist layer 86 over the metal seed layer 84.

In various implementations, the method includes forming electrical contacts 88 coupled to the metal seed layer 84 and within the first photoresist layer 86. The electrical contacts 88 may be any type of electrical contact disclosed herein. In various implementations, the electrical contacts 88 may include a first layer 90 and a second layer 92. In various implementations, the first layer 90 may include copper and the second layer 92 may include tin, silver, or a combination of tin and silver. In various implementations, the method of forming a semiconductor package includes removing the first photoresist layer 86 and etching the portions of the metal seed layer 84 away that are not covered by the electrical contacts, after the electrical contacts are formed.

In various implementations, the method of forming a semiconductor package includes forming and patterning a second photoresist layer 94 over the first side 76 of the wafer 72. In various implementations, the second photoresist layer covers the electrical contacts 88, while in other implementations, the second photoresist layer 94 does not cover the electrical contacts 88. The second photoresist layer 94 may be used to etch a plurality of notches 96 into the wafer 72. The method includes removing the second photoresist layer 94 after the plurality of notches are etched into the wafer.

A first mold compound may be applied into the plurality of notches and over the first side 76 of the wafer 72 in the same manner the first mold compound in FIG. 3 is applied. The remainder of the method for forming a semiconductor package as depicted in FIG. 10 may include exposing the electrical contacts through grinding, grinding the backside of the wafer to the plurality of notches, applying a second mold compound or laminate resin to a backside of the wafer, and singulating the wafer into a plurality of semiconductor packages. These portions of forming a semiconductor package may be the same as or similar to respective portions for forming a semiconductor package illustrated by FIG. 3 and previously disclosed herein.

In various implementations, the semiconductor package produced by the method depicted in FIG. 10 may include one or more metal pads, one or more passivation layers, a polyimide, a phenol resin, a polybenzoxazole, and any combination thereof, between the semiconductor die and the first mold compound.

Figure 11:
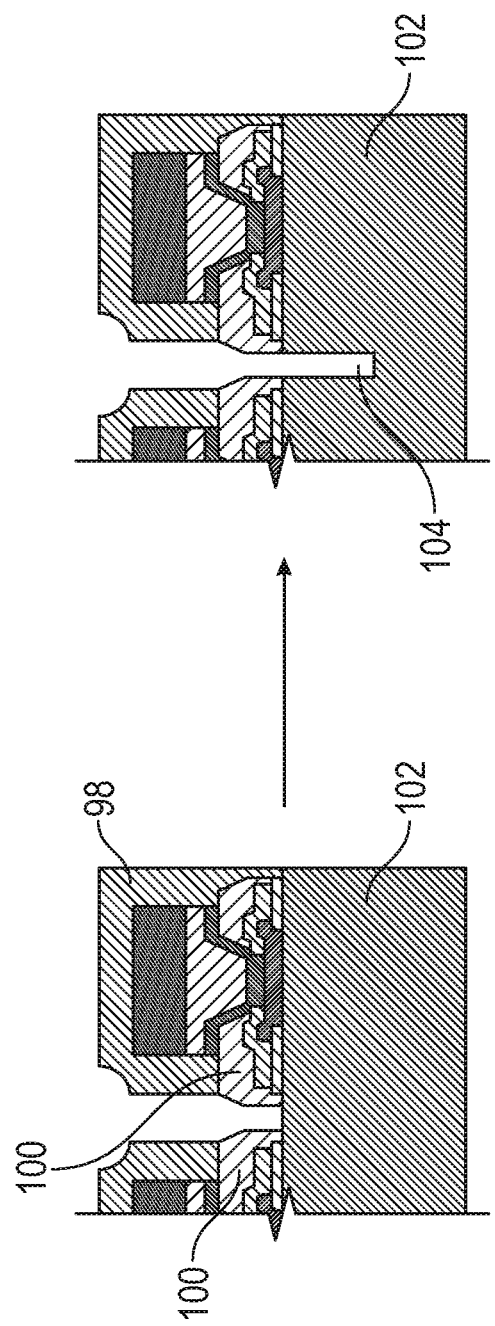
FIG. 11 illustrates a first alternative for forming the notches in the third process flow.

Referring to FIGS. 11-14, alternative methods for forming a plurality of notches in the process illustrated by FIG. 10 is illustrated. Referring to FIG. 11, a method of forming a plurality of notches using a patterned photoresist layer and one of a polyimide, polybenzoxazole, and a phenol resin in combination with an etching process is illustrated. In various implementations, a patterned photoresist layer 98 may be over a mask 100 including either a patterned polyimide layer, a patterned polybenzoxazole layer, or a patterned phenol resin layer. The mask 100 may be over a wafer 102. A notch 104 may be formed in the wafer 102 using the patterned photoresist layer and the mask using any etching process disclosed herein.

Figure 12:
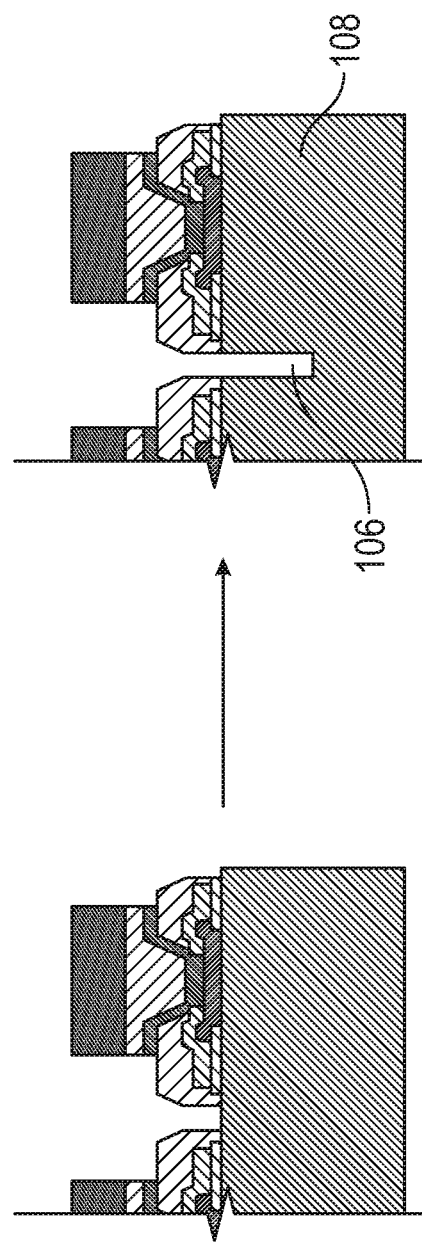
FIG. 12 illustrates a second alternative for forming the notches in the third process flow.

Referring to FIG. 12, a method of forming a plurality of notches using one of a polyimide, polybenzoxazole, and a phenol resin in combination with any etching process disclosed herein is illustrated. The method may be the same as the method depicted by FIG. 11, with the difference being that the method depicted by FIG. 12 does not include a patterned photoresist layer used to form a notch 106 into a wafer 108.

Figure 13:
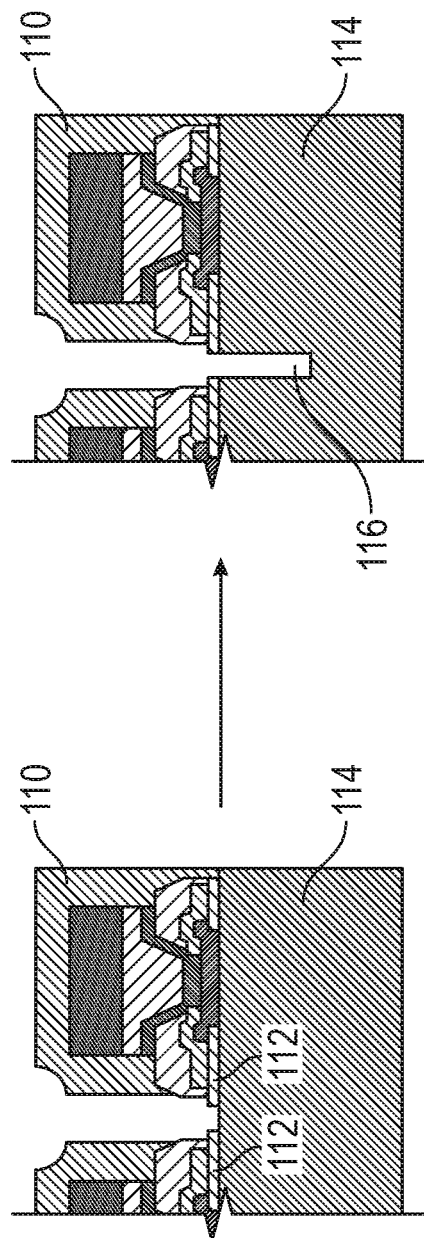
FIG. 13 illustrates a third alternative for forming the notches in the third process flow.

Referring to FIG. 13, a method of forming a plurality of notches using a patterned photoresist layer and passivation mask is illustrated. In various implementations, a patterned photoresist layer 110 may be over a passivation mask 112. The passivation mask 112 may include any passivation layer disclosed herein. The passivation mask 112 may be over a wafer 114. A notch 116 may be formed in the wafer 114 using the patterned photoresist layer 110 and the passivation mask 112 and any etching process disclosed herein.

Figure 14:
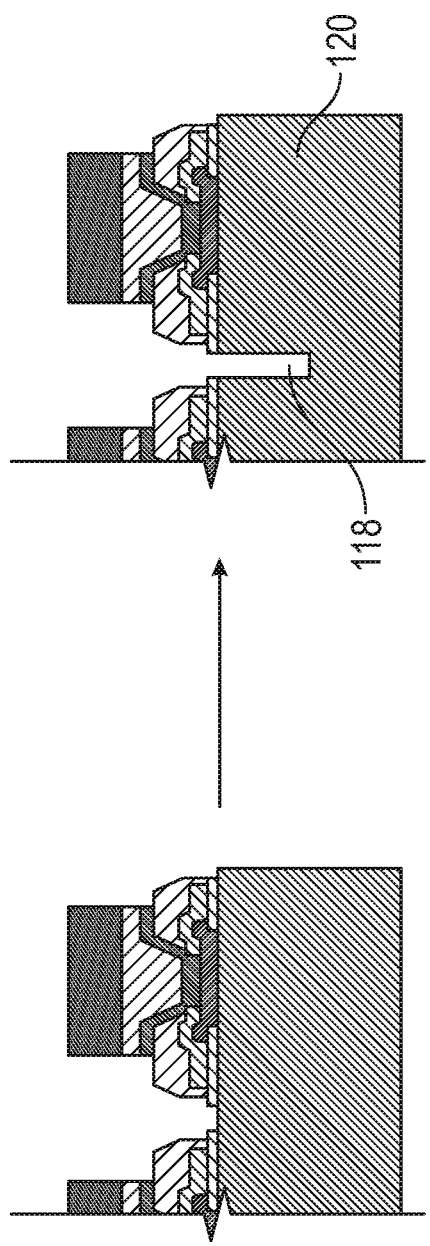
FIG. 14 illustrates a fourth alternative for forming the notches in the third process flow.

Referring to FIG. 14, a method of forming a plurality of notches using a passivation mask in combination with any of the etching method disclosed herein is illustrated. The method may be the same as the method depicted by FIG. 13, with the difference being that the method depicted by FIG. 14 does not include a patterned photoresist layer used to form a notch 116 into a wafer 118.

Figure 15:
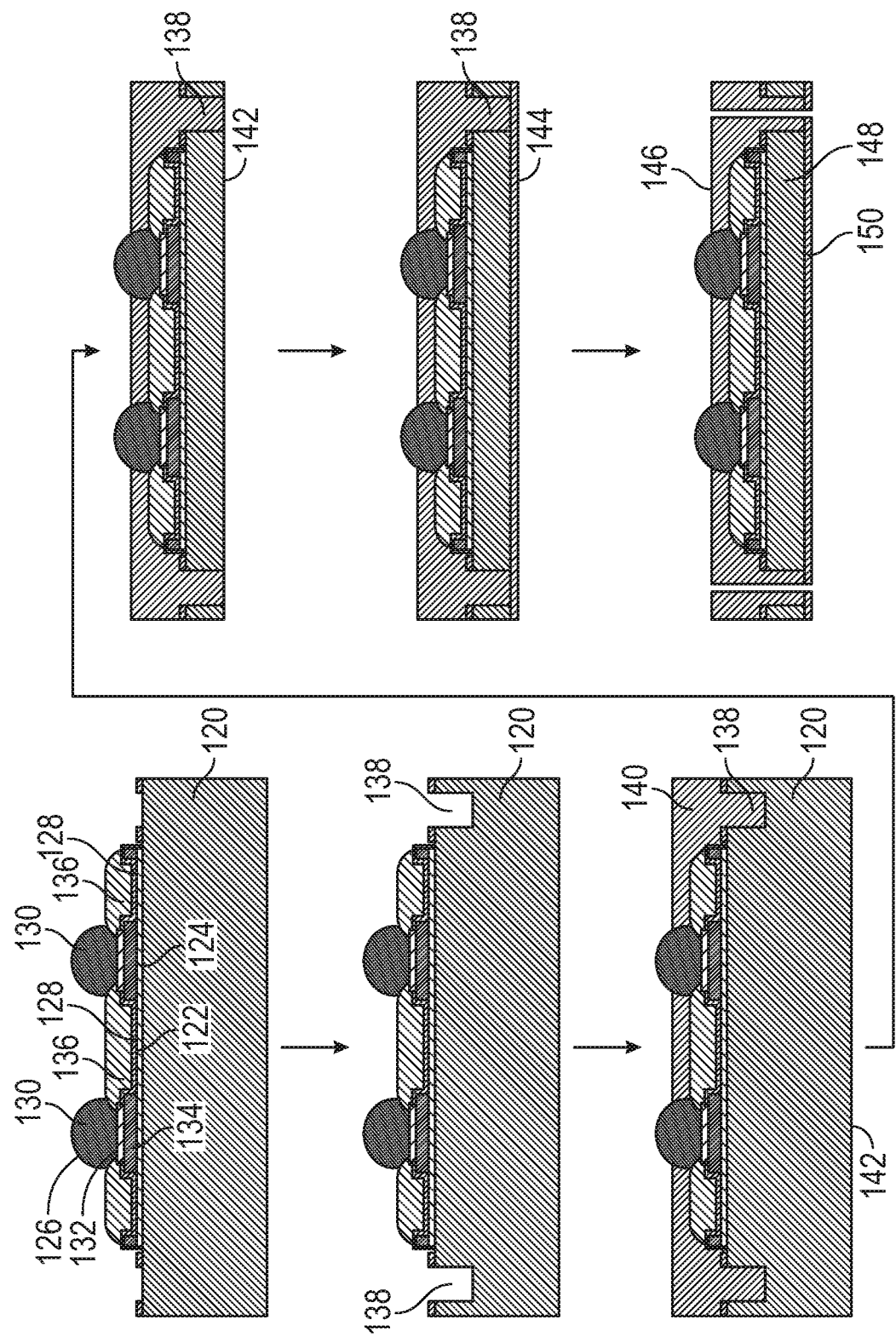
FIG. 15 is a fourth process flow illustrating the formation of a semiconductor package.

Referring to FIG. 15, a fourth process flow illustrating the formation of a semiconductor package is illustrated. The method for forming a semiconductor package illustrated in FIG. 15 includes providing a wafer 120. In various implementations, an interlayer 122 may be coupled to a first side 124 of the wafer 120. In various implementations, a passivation layer 128 may be coupled to the wafer 120. The passivation layer may be any type of passivation layer disclosed herein.

In various implementations, one or more electrical contacts 126 may be coupled to the wafer 120. In various implementations, the electrical contacts include a bump 130. The electrical contacts may include a first metal layer 132 coupled to the bump 130. The first metal layer may include any metal disclosed herein. In a particular implementation, the first metal layer includes nickel and gold. The electrical contacts 128 may include a second metal layer 134 coupled to the first metal layer 132. The second metal layer 134 may include any metal disclosed herein. In a particular implementation, the second metal layer 134 includes aluminum. In various implementations, a solder resist layer 136 may be coupled over the wafer 120. In other implementations, no solder resist layer is included.

In various implementations, the passivation layer 128 may be patterned and may directly contact portions of the wafer 120. In such implementations, the patterned passivation layer, or mask, may be used to etch a plurality of notches 138 into the first side 124 of the wafer 120 using any etching process disclosed herein. The plurality of notches may be etched using any method disclosed herein, and may be any type of notch previously disclosed herein.

In various implementations, a first mold compound 140 is applied into the plurality of notches 138 and over the first wafer 120. The first mold compound 140 may be any mold compound disclosed herein and may be applied using any technique disclosed herein. In various implementations, the first mold compound 140 does not entirely cover the electrical contacts 126, as is illustrated by FIG. 15. In other implementations, the first mold compound does entirely cover the electrical contacts 126. In implementations where the first mold compound 140 does entirely cover the electrical contacts 126, the first mold compound may be ground to expose the electrical contacts 126.

In various implementations, a second side 142 opposite the first side 124 of the wafer 120 may be ground using any grinding method disclosed herein to the plurality of notches. A second mold compound 144 or laminate resin may then be applied to the second side 142 of the wafer 120.

The wafer 120 may then be singulated into a plurality of semiconductor packages 146. The wafer may be singulated using any technique disclosed herein. The semiconductor die 148 with the semiconductor package 146 may have all six sides covered by a mold compound. In other implementations, the sixth side of the die 150 may be covered by a laminate resin.

In various implementations, the semiconductor package formed by the method illustrated in FIG. 15 may include either a solder resist layer, a passivation layer, an interlayer, or a combination of a solder resist layer, a passivation layer, and an interlayer coupled to the first side of the wafer and covered by the first mold compound.

In places where the description above refers to particular implementations of semiconductor packages and implementing components, sub-components, methods and sub-methods, it should be readily apparent that a number of modifications may be made without departing from the spirit thereof and that these implementations, implementing components, sub-components, methods and sub-methods may be applied to other semiconductor packages.

What is claimed is:

1. A method of forming a semiconductor package comprising:
    coupling a first passivation layer over a first side of a wafer;
    applying a polyimide layer over the first passivation layer;
    forming a plurality of electrical contacts on the first side of the wafer;
    applying a photoresist layer to the first side of the wafer;
    patterning the photoresist layer;
    etching a plurality of notches into the first side of the wafer using the photoresist layer;
    applying a first mold compound into the plurality of notches and over the first side of the wafer;
    grinding a second side of the wafer opposite the first side of the wafer to the plurality of notches formed in the first side of the wafer;
    applying one of a second mold compound and a laminate resin to a second side of the wafer; and
    singulating the wafer into a plurality of semiconductor packages, wherein six sides of a die included in each semiconductor package are covered by one of the first mold compound, the second mold compound, or the laminate resin.

2. The method of claim 1, wherein the first mold compound is applied using one of a printer molding technique and a compression molding technique.

3. The method of claim 1, wherein a perimeter of a first side of a die within the package is substantially one of an octagon and a rectangle with rounded corners.

4. The method of claim 1, wherein the plurality of notches are etched into the first side of the wafer using the photoresist layer and one of the polyimide, a polybenzoxazole, and a phenol resin.

5. The method of claim 1, wherein the plurality of notches are etched into the first side of the wafer using the photoresist layer and a passivation mask.

6. The method of claim 1, wherein one of a solder resist layer, an interlayer, and a combination of a solder resist layer and an interlayer is coupled to the first side of the wafer and covered by the first mold compound.

7. The method of claim 1, wherein an etching process is used to singulate the plurality of packages.

8. The method of claim 1, further comprising applying a second passivation layer over the first passivation layer.

9. The method of claim 1, wherein the polyimide layer covers a sidewall of the first passivation layer.

10. The method of claim 1, wherein the plurality of electrical contacts comprises a first layer and a second layer formed over the first layer.

11. A method of forming a semiconductor package comprising:
    forming a first passivation layer on a first side of a wafer;
    forming a second passivation layer over the first passivation layer;
    forming a polyimide layer over the second passivation layer;
    applying a first photoresist layer over the polyimide layer;
    patterning the first photoresist layer;
    forming electrical contacts coupled over the polyimide layer using the first photoresist layer;
    removing the first photoresist layer;
    etching a plurality of notches into the first side of the wafer;
    applying a first mold compound into the plurality of notches, over the electrical contacts, and over the first side of the wafer;
    exposing the electrical contacts through the first mold compound through grinding the first mold compound;
    forming a plurality of die through grinding a second side of the wafer opposite the first side of the wafer to the plurality of notches formed in the first side of the wafer;
    applying one of a second mold compound and a laminate resin to the second side of the wafer;
    singulating the wafer into a plurality of semiconductor packages, wherein each semiconductor die is covered by one of a first molding compound, the second molding compound, or a laminate resin on the first side, the second side, a third side, a fourth side, a fifth side, and a sixth side of each semiconductor die.

12. The method of claim 11, wherein a first side of a die within each semiconductor package comprises a perimeter that is one of an octagon and a rectangle with rounded edges.

13. The method of claim 11, wherein the first mold compound is anchored to a sidewall of the plurality of notches through a plurality of ridges formed in the sidewall of the plurality of notches.

14. The method of claim 13, wherein the plurality of ridges are formed using a deep reactive-ion etching technique during etching of the plurality of notches.

15. The method of claim 11, wherein the plurality of notches are etched into the first side of the wafer using one of the polyimide, a polybenzoxazole, and a phenol resin.

16. The method of claim 11, wherein the plurality of notches are etched into the first side of the wafer using the polyimide layer.

17. The method of claim 11, wherein one of a solder resist layer, an interlayer, and a combination of a solder resist layer and an interlayer is coupled to the first side of the wafer and covered by the first mold compound.

18. The method of claim 11, wherein the first passivation layer is used to form the plurality of notches in the first side of the wafer.

19. The method of claim 11, wherein the electrical contacts comprise a first layer and a second layer formed over the first layer.

* * * * *